United States Patent
Hsu et al.

(10) Patent No.: US 8,242,992 B2
(45) Date of Patent: Aug. 14, 2012

(54) DRIVING APPARATUS AND DRIVING METHOD THEREOF

(75) Inventors: Min-Chieh Hsu, Taipei County (TW); Kuang-Feng Sung, Taichung County (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 12/951,076

(22) Filed: Nov. 22, 2010

(65) Prior Publication Data
US 2011/0063031 A1 Mar. 17, 2011

Related U.S. Application Data

(62) Division of application No. 11/733,781, filed on Apr. 11, 2007.

(30) Foreign Application Priority Data

Dec. 29, 2006 (TW) .............................. 95150009 A

(51) Int. Cl.
*G09G 3/36* (2006.01)
(52) U.S. Cl. ........................ 345/87; 330/254; 327/108
(58) Field of Classification Search ............ 345/87–102, 345/38, 50
See application file for complete search history.

(56) References Cited

U.S. PATENT DOCUMENTS 5,990,748 A * 11/1999 Tomasini et al. ............. 330/292
2004/0263504 A1 * 12/2004 Kato ............................. 345/204

FOREIGN PATENT DOCUMENTS

TW 200417950 9/2004
TW 200419234 10/2004

OTHER PUBLICATIONS

"Office Action of Taiwan Counterpart Application", issued on Jul. 18, 2011, p. 1-p. 6, in which the listed references were cited.

* cited by examiner

*Primary Examiner* — Kevin M Nguyen
*Assistant Examiner* — Kenneth B Lee, Jr.
(74) *Attorney, Agent, or Firm* — Jianq Chyun IP Office

(57) ABSTRACT

A driving apparatus and a driving method thereof are provided. The driving apparatus includes a digital to analog converter and a signal amplifier. The digital to analog converter is used for receiving a digital data and converting the digital data to an analog signal. The signal amplifier is coupled to the digital to analog converter. The signal amplifier is used for receiving the analog signal to generate a driving signal. The signal amplifier also dynamically changes the driving ability of the driving signal according to at least one bit of the digital data.

9 Claims, 12 Drawing Sheets

DRIVING APPARATUS AND DRIVING METHOD THEREOF

CROSS-REFERENCE TO RELATED APPLICATION

This application is a divisional application of U.S. patent application Ser. No. 11/733,781, filed on Apr. 11, 2007, which claims the priority benefit of Taiwan application serial No. 95150009, filed on Dec. 29, 2006. The entirety each of the above-mentioned patent applications is hereby incorporated by reference herein and made a part of the specification.

BACKGROUND OF THE INVENTION

1. Field of the Invention

The present invention relates to a driving apparatus and a method of generating a driving signal, and more particularly to a driving apparatus and a method of generating a driving signal capable of reducing power consumption.

2. Description of Related Art

One of the characteristics of liquid crystal molecules is that they cannot remain unchanged under a certain fixed voltage. Otherwise, as time goes on, even if no voltage is applied, the liquid crystal molecules may not be able to rotate in response to an electric field variation as a result of characteristic disruption of the liquid crystal molecules so that different gray scales are formed. Therefore, driving the liquid crystal molecules by time varying applied voltage prevents characteristic disruption of the liquid crystal molecules is prevented. For example, a positive polarity voltage is applied to the liquid crystal molecules to rotate the liquid crystal molecules in a positive direction and then a negative polarity voltage is applied to the liquid crystal molecules next to rotate the liquid crystal molecules in a negative direction.

There are two methods of driving the liquid crystal molecules, one is a fixed common voltage driving method (normally labeled Vcom) while the other is a variable common voltage driving method. FIG. 1 is a diagram showing a driving method having a fixed common voltage. As shown in FIG. 1, this driving method uses the common voltage as a center voltage such that the output voltage of an operational amplifier (OPAMP) is divided into a positive and a negative polarity. Furthermore, each gray scale data (for example, 00~FF) has its voltages corresponding to a positive and a negative polarity. The output when the output voltage of the operational amplifier is greater than the common voltage is regarded as a positive polarity output and the output when the output voltage of the operational amplifier is smaller than the common voltage is regarded as a negative polarity output.

Regardless of whether the output voltage of the operational amplifier is a positive polarity or a negative polarity, in other words, regardless of whether the output voltage of the operational amplifier is higher or the common voltage is higher, a group of gray scales with identical brightness is produced as long as a fixed voltage difference exists between the output voltage of the operational amplifier and the common voltage. Although the gray scales are expressed identically, the difference in the direction of rotation of the liquid crystal molecules with respect to the positive and the negative polarity prevents the direction of rotation fixed in the same direction and leads to characteristic disruption of the liquid crystal molecules.

However, the foregoing driving method has its defects. For example, assuming a complete black frame (gray scale data is 00) needs to output on a display panel. When the output voltage of the operational amplifier is a positive polarity and if the gray scale data 00 is smaller than G1 (G1 and G2 are any random gray scale data), then the output voltage of the operational amplifier must reach the level in region 1. On the other hand, when the output voltage of the operational amplifier is a negative polarity and if the gray scale data is smaller than G2, then the output voltage of the operational amplifier must reach the level in region 4. More simply, the output voltage of the operational amplifier vary over a large voltage range when the liquid crystal molecules make a transition from a positive polarity to a negative polarity.

Similarly, the driving method having a variable common voltage also has the same problem. FIG. 2 is a diagram showing a driving method having a variable common voltage. As shown in FIG. 2, each gray scale data (for example, 00~FF) still has its voltages corresponding a positive and a negative polarity. The output when the output voltage of the operational amplifier is greater than the common voltage is regarded as a positive polarity output and the output when the output voltage of the operational amplifier is smaller than the common voltage is regarded as a negative polarity output. Regardless of whether the output voltage of the operational amplifier is higher or the common voltage is higher, a group of gray scales with identical brightness is produced as long as a fixed voltage difference exists between the output voltage of the operational amplifier and the common voltage.

However, the output voltage of the operational amplifier changes over a wide range under the following four conditions. First, when the variation in the gray scale data is of the same polarity, assuming a positive polarity, and inter-converts between 00 and FF, if the gray scale data is smaller than G1 (G1, G2, G3 and G4 are random gray scale data), and the gray scale data FF is greater than G4, then the output voltage of the operational amplifier transits between region 1 and region 4. Second, assuming the variation of the gray scale data is a transition between the negative polarity gray scale data 00 and the negative polarity gray scale data FF, and the gray scale data FF is greater than G3, then the output voltage of the operational amplifier transits between region 3 and region 2.

Third, when the variation of the gray scale data has different polarities, assuming the gray scale data is 00, and the polarity transits between the positive polarity and the negative polarity, if the positive polarity gray scale data 00 is smaller than G1 and the negative polarity gray scale data 00 is smaller than G2, then the output voltage of the operational amplifier transits between region 1 and region 3. Fourth, assuming the variation of the gray scale data transits between the positive polarity gray scale data FF and the negative polarity gray scale data FF, if the positive polarity gray scale data FF is greater than G3 and the negative polarity gray scale data FF is greater than G4, then the output voltage of the operational amplifier transits between region 2 and region 4.

As mentioned in the foregoing description, when the output voltage of the operational amplifier varies over a large range so that the transition time of the output voltage of the operational amplifier is longer, the stabilization time of the voltage change is also longer. Hence, the application range is restricted. From the perspective of slew rate (SR, that is, the largest output voltage variation permitted of an electronic device $dV_0(t)/dt$), the slew rate of an operational amplifier may be represented by using a formula $SR=I/C_C$, wherein I is the current of the operational amplifier, $C_C$ is a compensation capacitance coupled to the operational amplifier. If the output voltage difference of the operational amplifier is 10 volts (V) and the transition is completed in 5 μs, then the slew rate SR is 2V/μs. However, if the transition is completed in 2.5 μs, then the slew rate SR is 4V/μs. In other words, the current of the operational amplifier has to be increased one fold or the compensation capacitance has to be reduced by half.

The compensation capacitance may be reduced so as to shorten the stabilization time of the output voltage transition of the operational amplifier. In general, the smaller the compensation capacitance, the shorter will be the transition time of the output voltage of the operational amplifier because the transition time of the output voltage of the operational amplifier is proportional to the compensation capacitance. However, this will easily lead to oscillation in the operational amplifier. Alternatively, the current of the operational amplifier may be increased. In general, the greater the current of the operational amplifier, the shorter will be the transition time of the output voltage of the operational amplifier because the transition time of the output voltage of the operational amplifier is inversely proportional to the current of the operational amplifier. Yet, quickening the stabilization time by purely increasing the current of the operational amplifier will lead to a significant increase in power consumption that might adversely affect product competitiveness.

SUMMARY OF THE INVENTION

Accordingly, the present invention is directed to a driving apparatus and a method of generating a driving signal to reduce power consumption.

The present invention is also directed to a driving apparatus and a method of generating a driving signal capable of dynamically changing the stabilization time of switching an output voltage by the driving apparatus.

To achieve these and other advantages, as embodied and broadly described herein, the invention provides a driving apparatus that includes a digital to analog converter and a signal amplifier. The digital to analog converter is used for receiving a digital data and converting the digital data into an analog signal. The signal amplifier is coupled to the digital to analog converter. The signal amplifier is used for receiving the analog signal to generate a driving signal. The signal amplifier also dynamically changes the driving capability of the driving signal according to at least one bit of the digital data.

The present invention also provides a driving apparatus that includes a digital to analog converter, a control circuit and a signal amplifier. The digital to analog converter is used for receiving a digital data and converting the digital data to an analog signal. The control circuit is used for generating a control signal according to at least one bit of the digital data. The signal amplifier is coupled to the digital to analog converter and the control circuit for receiving the analog signal to generate a driving signal. The signal amplifier also dynamically changes the driving ability of the driving signal according to the control signal.

The present invention also provides a driving method for a driving apparatus. The driving method includes the following steps: converting a digital data into an analog signal, dynamically determining a driving ability according to at least one bit of the digital data, and generating a driving signal according to the analog signal and the determined driving capability.

According to an embodiment of the present invention, the signal amplifier includes an operational amplifier and the driving signal is generated by the operational amplifier. The operational amplifier includes a positive input terminal, a negative input terminal, a control terminal and an output terminal. The positive input terminal of the operational amplifier receives the analog signal. The negative input terminal of the operational amplifier is coupled to the output terminal of the operational amplifier. The control terminal of the operational amplifier receives at least one bit of the digital data. The output terminal of the operational amplifier outputs the driving signal.

According to an embodiment of the present invention, the signal amplifier includes an operational amplifier and the driving signal is produced by the operational amplifier. The operational amplifier includes a positive input terminal, a negative input terminal, a control terminal and an output terminal. The positive input terminal of the operational amplifier receives the analog signal. The negative input terminal of the operational amplifier is coupled to the output terminal of the operational amplifier. The control terminal of the operational amplifier receives the control signal. The output terminal of the operational amplifier outputs the driving signal.

According to an embodiment of the present invention, the operational amplifier further includes a first input stage and a gain stage. The first input stage includes a first transistor, a second transistor and a first controlled current source. The gate of the first transistor serves as the positive input terminal of the operational amplifier. The gate of the second transistor serves as the negative input terminal of the operational amplifier. A first terminal of the first controlled current source is coupled to a first source/drain of the first transistor and the second transistor, and a second terminal of the first controlled current source is coupled to a first voltage. The first controlled current source provides a suitable current according to the signal at the control terminal of the operational amplifier. A first input terminal and a second input terminal of the gain stage are coupled to a second source/drain of the first transistor and a second source/drain of the second transistor respectively. The driving signal is generated according to the first input terminal and the second input terminal of the gain stage.

According to an embodiment of the present invention, the first controlled current source includes a first current source, a second current source and a first switch. A first terminal of the first current source serves as the first terminal of the first controlled current source and a second terminal of the first current source serves as the second terminal of the first controlled current source. A first terminal of the second current source is coupled to the first terminal of the first current source. A first terminal of the first switch is coupled to the second terminal of the second current source and a second terminal of the first switch is coupled to the second terminal of the first current source so that the on-off state of the first switch is determined by the signal at the control terminal of the operational amplifier.

According to another embodiment of the present invention, the operational amplifier further includes a second input stage. The second input stage includes a third transistor, a fourth transistor and a second controlled current source. The gate of the third transistor is coupled to the gate of the first transistor and a second source/drain of the third transistor is coupled to a third input terminal of the gain stage. The gate of the fourth transistor is coupled to the gate of the second transistor and a second source/drain of the fourth transistor is coupled to a fourth input terminal of the gain stage. A first terminal of the second controlled current source is coupled to a first source/drain of the third transistor and the fourth transistor and a second terminal of the second controlled current source is coupled to a second voltage. Furthermore, the amount of current provided by the second controlled current source is determined by the signal at the control terminal of the operational amplifier. The gain stage generates the driving signal according to the first input terminal, the second input terminal, the third input terminal and the fourth input terminal of the gain stage.

According to another embodiment of the present invention, the second controlled current source includes a third current source, a fourth current source and a second switch. A first terminal of the third current source serves as the first terminal of the second controlled current source and a second terminal of the third current source serves as the second terminal of the second controlled current source. A first terminal of the fourth current source is coupled to the first terminal of the third current source. A first terminal of the second switch is coupled to a second terminal of the fourth current source and a second terminal of the second switch is coupled to the second terminal of the third current source so that the on-off state of the second switch is determined by the signal at the control terminal of the operational amplifier.

According to yet another embodiment of the present invention, the operational amplifier further includes an input stage and a gain stage. The input stage is coupled to the positive input terminal and the negative input terminal of the operational amplifier for receiving the analog signal. The gain stage is coupled to the input stage for generating the driving signal according to the output of the input stage and determining the driving ability of the driving signal according to the control terminal of the operational amplifier.

According to the driving apparatus in the foregoing embodiment, the input stage includes a first transistor, a second transistor, a first current source, a third transistor and a fourth transistor. The gate of the first transistor serves as the positive input terminal of the operational amplifier. The gate of the second transistor serves as the negative input terminal of the operational amplifier. A first terminal of the first current source is coupled to a first source/drain of the first transistor and a first source/drain of the second transistor and a second terminal of the first current source is coupled to the first voltage. A first source/drain of the third transistor is coupled to a second source/drain of the first transistor and the gate of the third transistor and a second source/drain of the third transistor is coupled to the second voltage. A first source/drain of the fourth transistor is coupled to a second source/drain of the second transistor. The gate of the fourth transistor is coupled to the gate of the third transistor. A second source/drain of the fourth transistor is coupled to a second voltage. The signal from the first source/drain of the fourth transistor serves as the output of the input stage.

According to the foregoing embodiment of the present invention, the gain stage includes a fifth transistor, a controlled capacitance and a second current source. The gate of the fifth transistor receives the output of the input stage and a second source/drain of the fifth transistor receives the second voltage. A first terminal and a second terminal of the controlled capacitance are coupled to the gate and a source/drain of the fifth transistor. The controlled capacitance provides an amount of capacitance according to the signal at the control terminal of the operational amplifier. The second current source is coupled between the first source/drain of the fifth transistor and the first voltage. The signal from the first source/drain of the fifth transistor serves as the driving signal.

According to the foregoing embodiment of the present invention, the controlled capacitance includes a first capacitor, a second capacitor and a switch. A first terminal and a second terminal of the first capacitor serve as the first terminal and the second terminal of the controlled capacitance. A first terminal of the second capacitor is coupled to the first terminal of the first capacitor. A first terminal and a second terminal of the switch are coupled to a second terminal of the second capacitor and a second terminal of the first capacitor respectively for determining the conductive state of the switch according to the signal at the control terminal of the operational amplifier.

According to another embodiment of the present invention, the input stage includes an operational amplifying circuit. A positive input terminal of the operational amplifying circuit receives the analog signal. The signal output from the operational amplifying circuit is the output from the input stage.

According to the foregoing embodiment of the present invention, the gain stage includes a gain circuit and a controlled capacitance. An input terminal of the gain circuit is coupled to the output terminal of the operational amplifying circuit. A first terminal and a second terminal of the controlled capacitance are coupled to an input terminal and an output terminal of the gain circuit respectively. The controlled capacitance provides an amount of capacitance according to the signal at the control terminal of the operational amplifier.

According to the foregoing embodiment of the present invention, the controlled capacitance includes a first capacitor, a second capacitor and a switch. A first terminal and a second terminal of the first capacitor serve as the first terminal and the second terminal of the controlled capacitance respectively. A first terminal of the second capacitor is coupled to the first terminal of the first capacitor. A first terminal and a second terminal of the switch are coupled to a second terminal of the second capacitor and the second terminal of the first transistor for determining the conductive state of the switch according to the signal at the control terminal of the operational amplifier.

According to an embodiment of the present invention, the driving apparatus further includes a latching circuit for latching and providing digital data.

According to the driving apparatus in an embodiment of the present invention, the control signal is generated by a control circuit. The control circuit includes a counting circuit and an AND gate. The counting circuit is used for receiving and counting clock signals. When the counting in the counting circuit reaches a preset value, the result of the counting is output. The AND gate is used for receiving the counting result and at least one bit of the digital data and generate the control signal accordingly.

According to another embodiment of the present invention, the control signal is generated by a control circuit. The control circuit includes a delay circuit and a NOR gate. The delay circuit is used for receiving at least one bit of the digital data and producing a delay. The NOR gate is coupled to the delay circuit for receiving at least one bit of the digital data and the output from the delay circuit and generate the control signal accordingly.

According to another embodiment of the present invention, a control circuit generates the control signal. The control circuit includes a compare circuit and a conversion circuit. The compare circuit is used for receiving and comparing a reference value with the driving signal. The conversion circuit is coupled to the compare circuit for converting at least one bit of the received digital data into a control signal according to the result of the comparison by the compare circuit.

In the present invention, the digital data is used to determine the range of the output voltage of the operational amplifier. When the range exceeds a pre-determined value, the slew rate of the operational amplifier is dynamically changed according to at least one bit of the digital data so that different supply currents (current is provided only when it is needed) are provided. Hence, the driving capability of the driving signal output by the operational amplifier is dynamically changed to save power consumption. The method of changing the slew rate of the operational amplifier includes controlling the size of current in the operational amplifier, or changing the size of the compensation capacitance of the operational amplifier, or simultaneously changing both. Therefore, the present invention is able to dynamically adjust the driving ability of the driving signal according to the range of the output voltage such that an optimal balance between the shortening of the stabilization time of the transition of output voltage of the operational amplifier and the power consumption.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
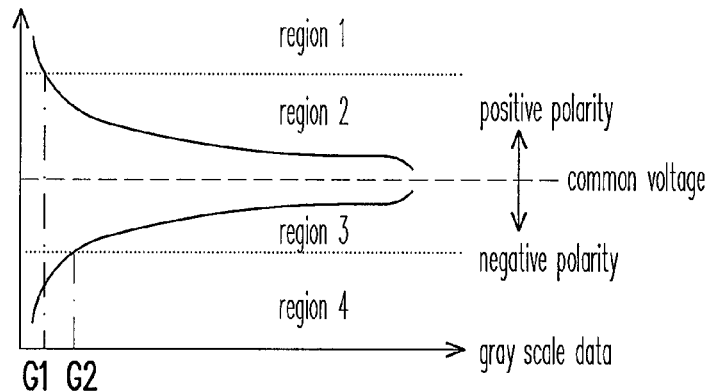
FIG. 1 is a diagram showing a driving method having a fixed common voltage.
Figure 2:
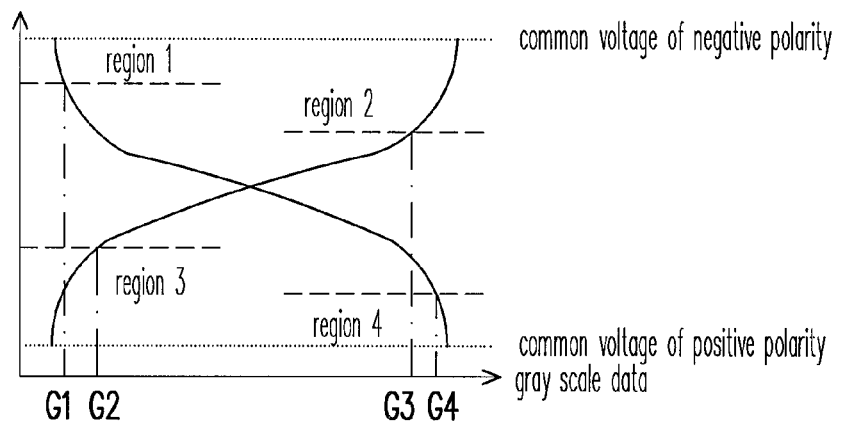
FIG. 2 is a diagram showing a driving method having a variable common voltage.

Reference will now be made in detail to the present preferred embodiments of the invention, examples of which are illustrated in the accompanying drawings. Wherever possible, the same reference numbers are used in the drawings and the description to refer to the same or like parts.

For the purpose of describing the present invention, the driving apparatus in the following embodiments are source driven apparatus for driving liquid crystal display panel. However, this is not intended to limit the applications of the present invention.

Figure 3:
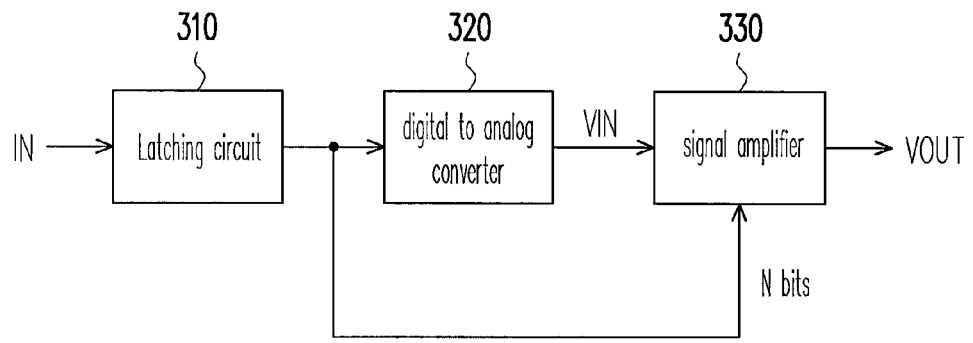
FIG. 3 is a block diagram of a driving apparatus according to an embodiment of the present invention.
Figure 4:
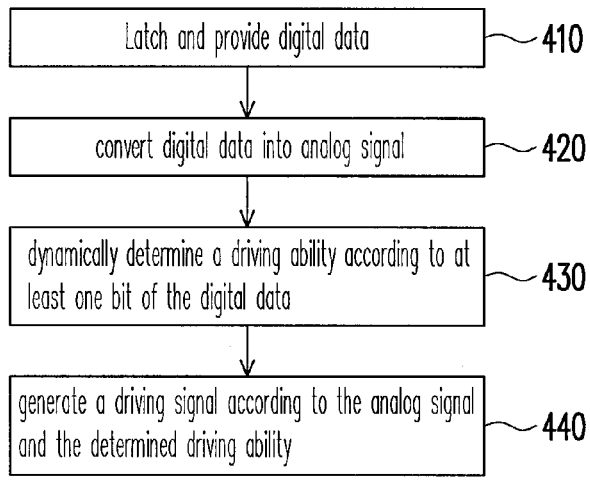
FIG. 4 is flow diagram showing a method of generating a driving signal according to an embodiment of the present invention.

FIG. 3 is a block diagram of a driving apparatus according to an embodiment of the present invention. FIG. 4 is flow diagram showing a method of generating a driving signal according to an embodiment of the present invention. Refer to FIGS. 3 and 4 according to the requirements in the description. The driving apparatus in FIG. 3 includes a latching circuit 310, a digital to analog converter 320 and a signal amplifier 330. The latching circuit 310 receives a digital data IN and output the digital data IN after latching the digital data IN (step 410 in FIG. 4). The digital to analog converter 320 receives the digital data IN output from the latching circuit 310 and converts the digital data IN into an analog signal VIN (step 420 in FIG. 4). The signal amplifier 330 receives the analog signal VIN and dynamically determines a driving ability according to at least one bit of the digital data (step 430 of FIG. 4). Next, a driving signal VOUT is generated according to the analog signal VIN and the determined driving ability (step 440 in FIG. 4).

Figure 5:
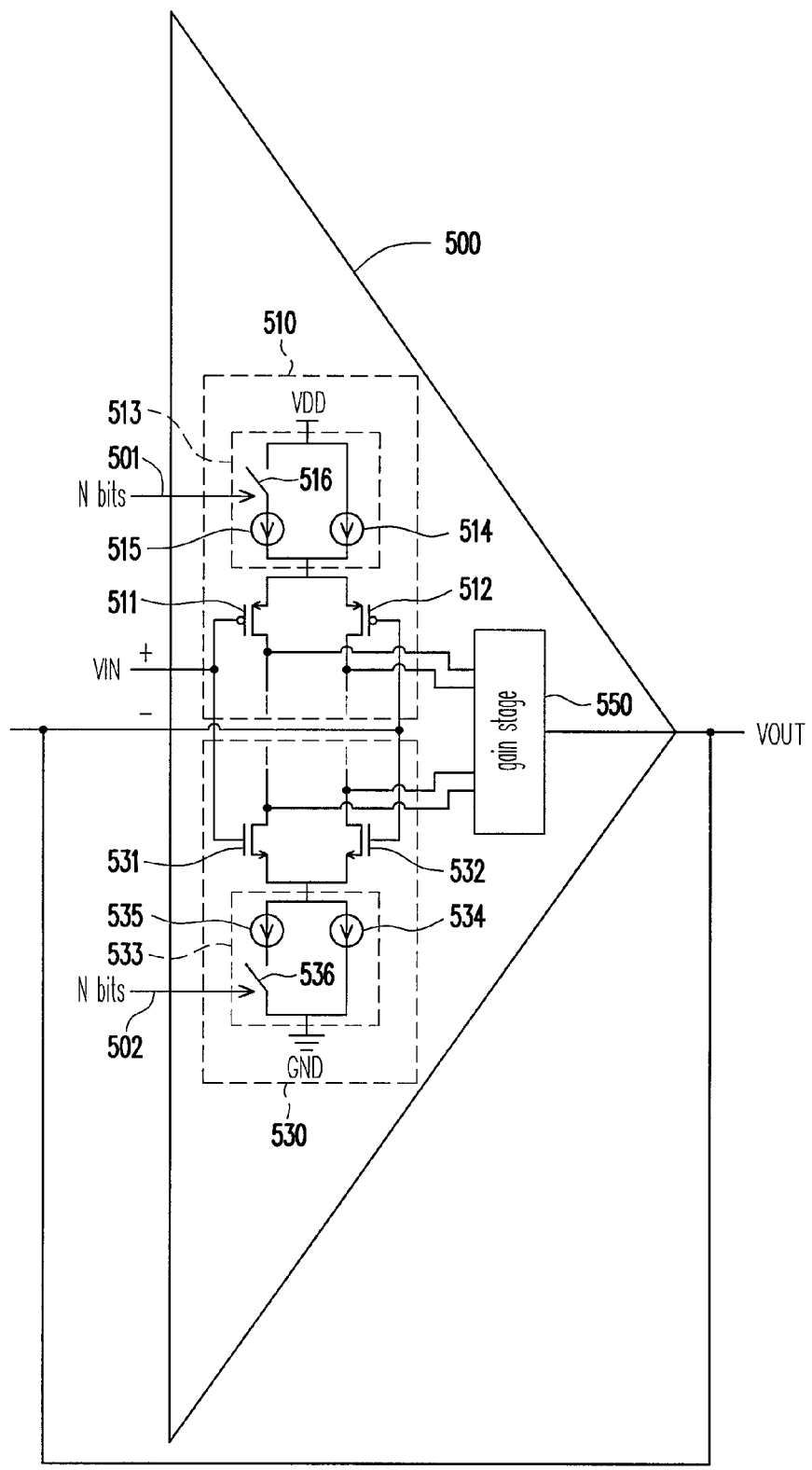
FIG. 5 is a schematic circuit diagram of an operational amplifier according to an embodiment of the present invention.

The signal amplifier 330 in FIG. 3 is implemented using an operational amplifier as shown in FIG. 5. FIG. 5 is a schematic circuit diagram of an operational amplifier according to an embodiment of the present invention. As shown in FIG. 5, the operational amplifier includes a positive input terminal, a negative input terminal, control terminals (for example, 501 and 502) and an output terminal. The positive input terminal of the operational amplifier receives the analog signal VIN and the negative input terminal of the operational amplifier is coupled to the output terminal of the operational amplifier. The control terminals 501 and 502 of the operational amplifier receive at least one bit of the digital data IN. The output terminal of the operational amplifier outputs the driving signal VOUT.

As described above, by controlling the size of current of the operational amplifier, or changing the size of the compensation capacitor of the operational amplifier, the stabilizing time of the output voltage transition of the operational amplifier can be changed. Hence, the driving capability of a driving signal from the operational amplifier is changed. FIG. 5 is a typical circuit for changing the driving ability of a driving signal output from the operational amplifier by controlling the size of the current from the operational amplifier.

The operational amplifier 500 in FIG. 5 includes a first input stage 510, a second input stage 530 and a gain stage 550. The input stage 510 includes transistors 511, 512 and a controlled current source 513. In the preset embodiment, the transistors 511 and 512 are implemented using P-type metal oxide semiconductor field effect transistor (P-MOSFET). The gate of the transistor 511 and the gate of the transistor 512 serve as the positive and negative input terminals of the operational amplifier 500 respectively.

A first terminal of the controlled current source 513 is coupled to the source of the transistors 511 and 512 and a second terminal of the controlled current source 513 is coupled to a power voltage VDD (that is, a first voltage). Furthermore, the controlled current source 513 provides an amount of current as determined by a signal at the control terminal 501 of the operational amplifier. The controlled current source 513 includes current sources 514 and 515 and a switch 516. A first terminal (for example, the current drain terminal) of the current source 514 serves as the first terminal of the controlled current source 513. A second terminal (for example, the current supply terminal) of the current source 514 serves as the second terminal of the controlled current source 513. A first terminal of the current source 515 is coupled to the first terminal of the current source 514. A first terminal of the switch 516 is coupled to a second terminal of the current source 515 and a second terminal of the switch 516 is coupled to a second terminal of the current source 514. The on-off state of the switch 516 is determined by the signal at the control terminal 501 of the operational amplifier.

The input stage 530 includes transistors 531, 532 and a controlled current source 533. In the present embodiment, the transistors 531 and 532 are implemented using N-type metal oxide semiconductor field effect transistor (N-MOSFET). The gate of the transistor 531 is coupled to the gate of the transistor 511. The gate of the transistor 532 is coupled to the gate of the transistor 512.

A first terminal of the controlled current source 533 is coupled to the source of the transistors 531 and 532 and a second terminal of the controlled current source 533 is coupled to a ground voltage GND (that is, a second voltage). The second controlled current source provides an amount of current determined by a signal at the control terminal 502 of the operational amplifier. The controlled current source 533 includes current sources 534 and 535 and a switch 536. A first terminal of the current source 534 serves as the first terminal of the controlled current source 533 and a second terminal of the current source 534 serves as the second terminal of the controlled current source 533. A first terminal of the current source 535 is coupled to the first terminal of the current source 534. A first terminal of the switch 536 is coupled to a second terminal of the current source 535 and a second terminal of the switch 536 is coupled to the second terminal of the current source 534. The on-off state of the switch 536 is determined by the signal at the control terminal 502 of the operational amplifier.

A first input terminal, a second input terminal, a third input terminal and a fourth input terminal of the gain stage 550 are coupled to the drain of the transistors 511, 512, 531 and 532 respectively. The gain stage 550 generates a driving signal VOUT according to the first, second, third and fourth input terminals.

The operation of the switches 516 and 536 is as follows. When one of the bits of the digital data IN (that is, N=1) serves as the input to the control terminals 501 and 502 shown in FIG. 5 and this bit is the most significant bit (MSB) of the digital data IN, if this bit is in a first state (for example, logic '0'), then the switches 516 and 536 are short-circuited so that the current sources 514, 515, 534 and 535 simultaneously supply current to increase the slew rate and accelerate the stabilization time of the output voltage of the operational amplifier. Conversely, if this bit is in the second state (for example, logic '1'), then the switches 516 and 536 are opened so that only the current sources 514 and 534 supply current. With the current sources 515 and 535 not supplying current, the original slew rate is restored. Thus, different supply current may be provided according to the state of this bit and power may be saved through supplying a current only on demand.

Figure 5A:
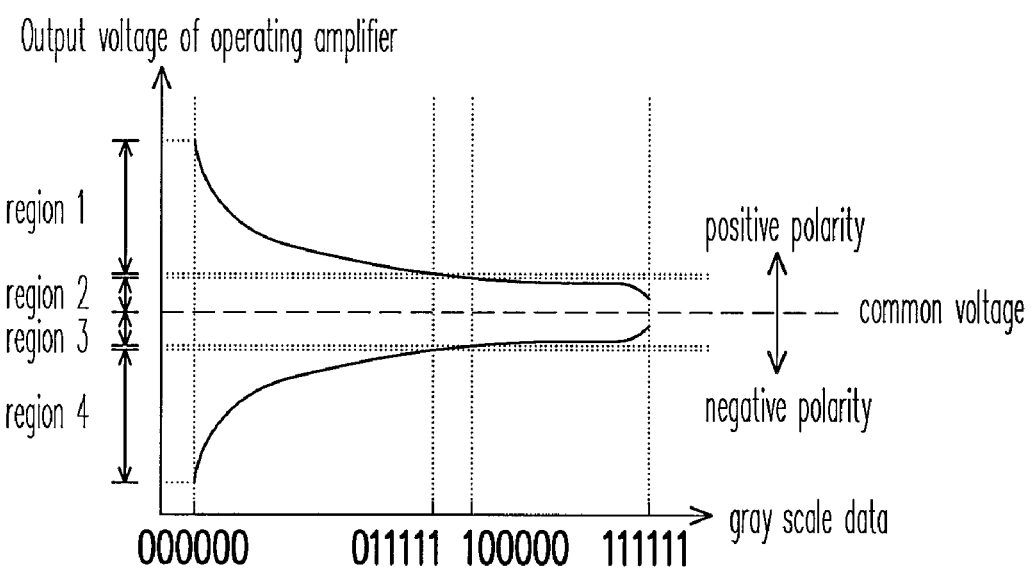
FIG. 5A is a diagram showing the relationship between controlling the output voltage of an amplifier and the gray scale data for describing the present invention.

FIG. 5A is a diagram showing the relationship between controlling the output voltage of an amplifier and the gray scale data for describing the present invention. To simplify the description, the driving method having a fixed common voltage is used as an example. However, this is not intended to limit the scope of the present invention. As shown in FIG. 5A, assuming that the digital data IN (the gray scale data) has 6 bits and region 1 and region 4 correspond to the gray scale data range 000000~011111 and region 2 and the region 3 correspond to the gray scale data range 100000~111111. If the digital data IN is between 000000~011111, then the output voltage will lie inside region 1 when the output voltage of the operational amplifier has a positive polarity and the output voltage will lie inside region 4 when the output voltage of the operational amplifier has a negative polarity. By using the foregoing design scheme, the MSB of the digital data IN is '0' when the output voltage lies inside region 1 or region 4, and the MSB of the digital data IN is '1' when the output voltage lies inside region 2 or region 3.

Therefore, the MSB of the digital data IN may be utilized to design the on-off state of the switches 516 and 536 in FIG. 5. When the digital data IN is between 000000~011111, the MSB is '0'. Since the output voltage of the operational amplifier lies in region 1 or region 4, the output voltage range is larger and the stabilizing time of the voltage transition is longer. Therefore, the switches 516 and 536 in FIG. 5 are may be short-circuited so that the current sources 514, 515, 534 and 535 can simultaneously supply a current to increase the slew rate of the operational amplifier and shorten the stabilization time of the voltage transition.

Conversely, when the digital data IN is between 100000~111111, the MSB is '1'. Since the output voltage of the operational amplifier lies in region 2 or region 3, the output voltage range is smaller and the stabilizing time of the voltage transition is shorter. Therefore, the switches 516 and 536 in FIG. 5 are opened such that only the current sources 514 and 534 provide a current to save power consumption.

Figure 6:
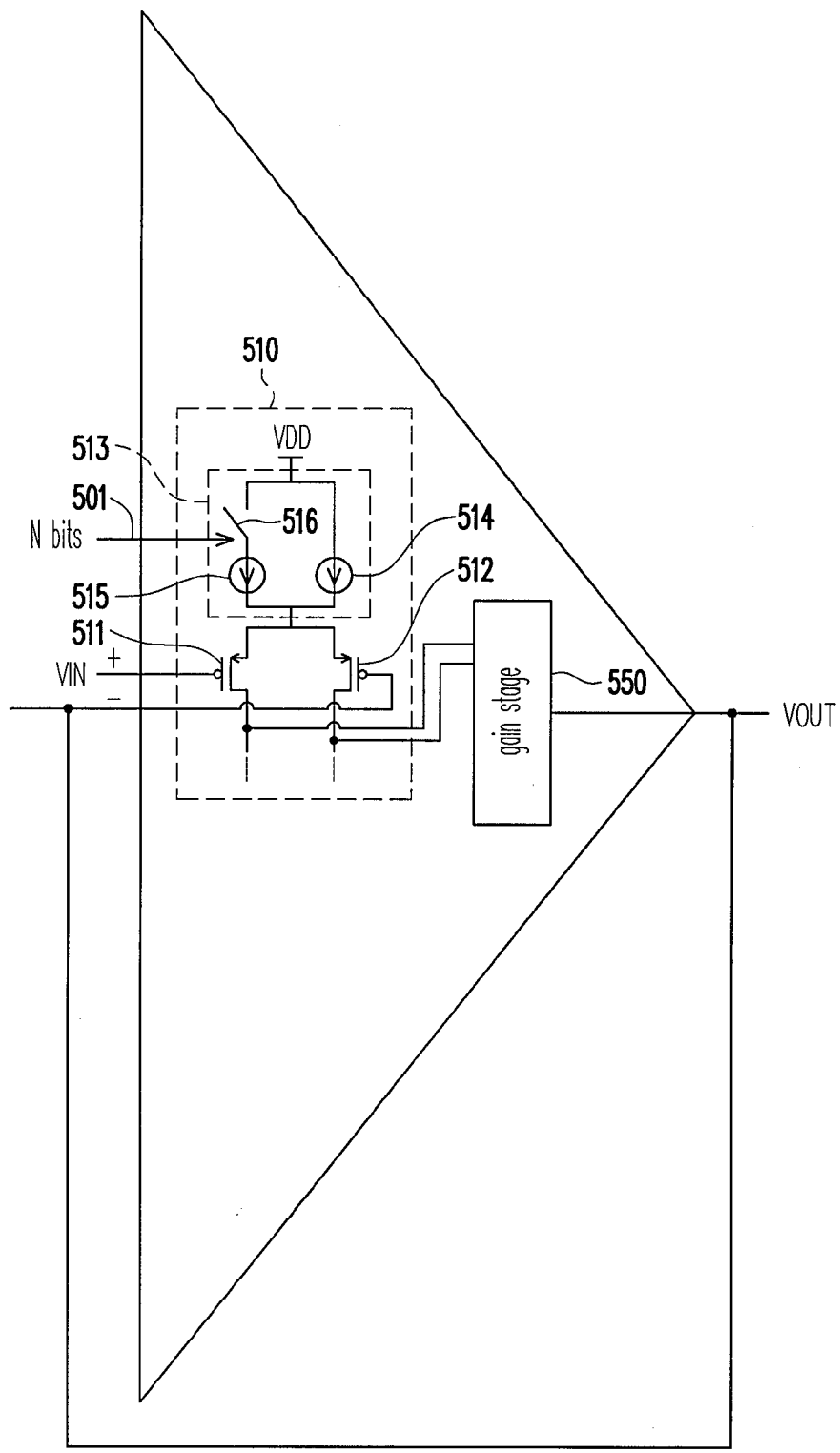
FIGS. 6, 7 and 8 are circuit diagrams of operational amplifiers according to another embodiment of the present invention.
Figure 7:
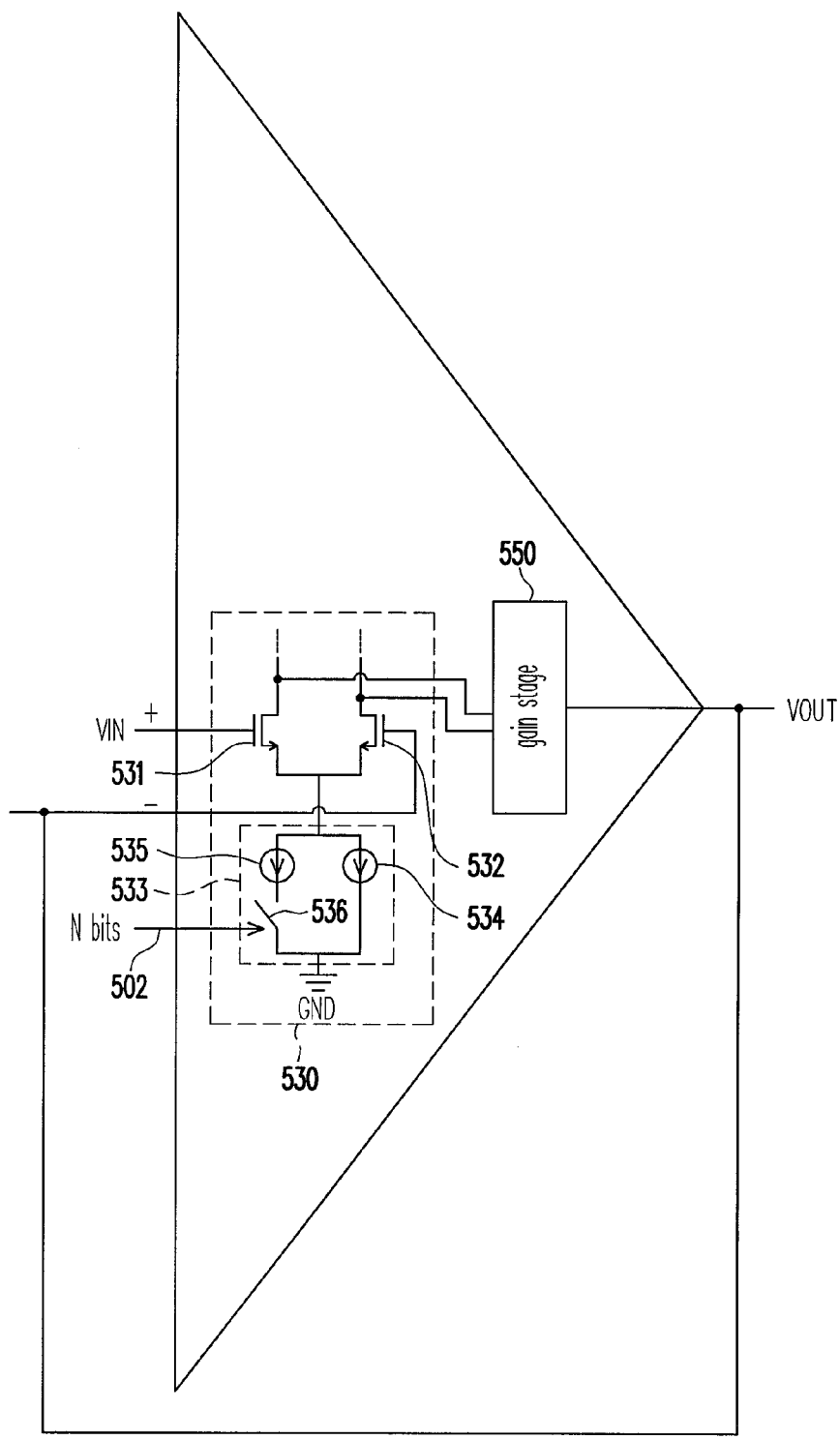

However, anyone skilled in the art may notice that an operational amplifier comprising just the input stage 510 and the gain stage 550 as shown in FIG. 6 or an operational amplifier comprising just the input stage 530 and the gain stage 550 as shown in FIG. 7 can be used implement the present invention. Here, FIGS. 6 and 7 are circuit diagrams of operational amplifiers according to another embodiment of the present invention.

After describing an example of utilizing the control of the current in the operational amplifier to change the driving ability of the driving signal, two examples of utilizing the change in compensating capacitance of the operational amplifier to change the driving ability of the driving signal are described below. The same signal amplifier 330 in FIG. 3 is used as an example.

Figure 8:
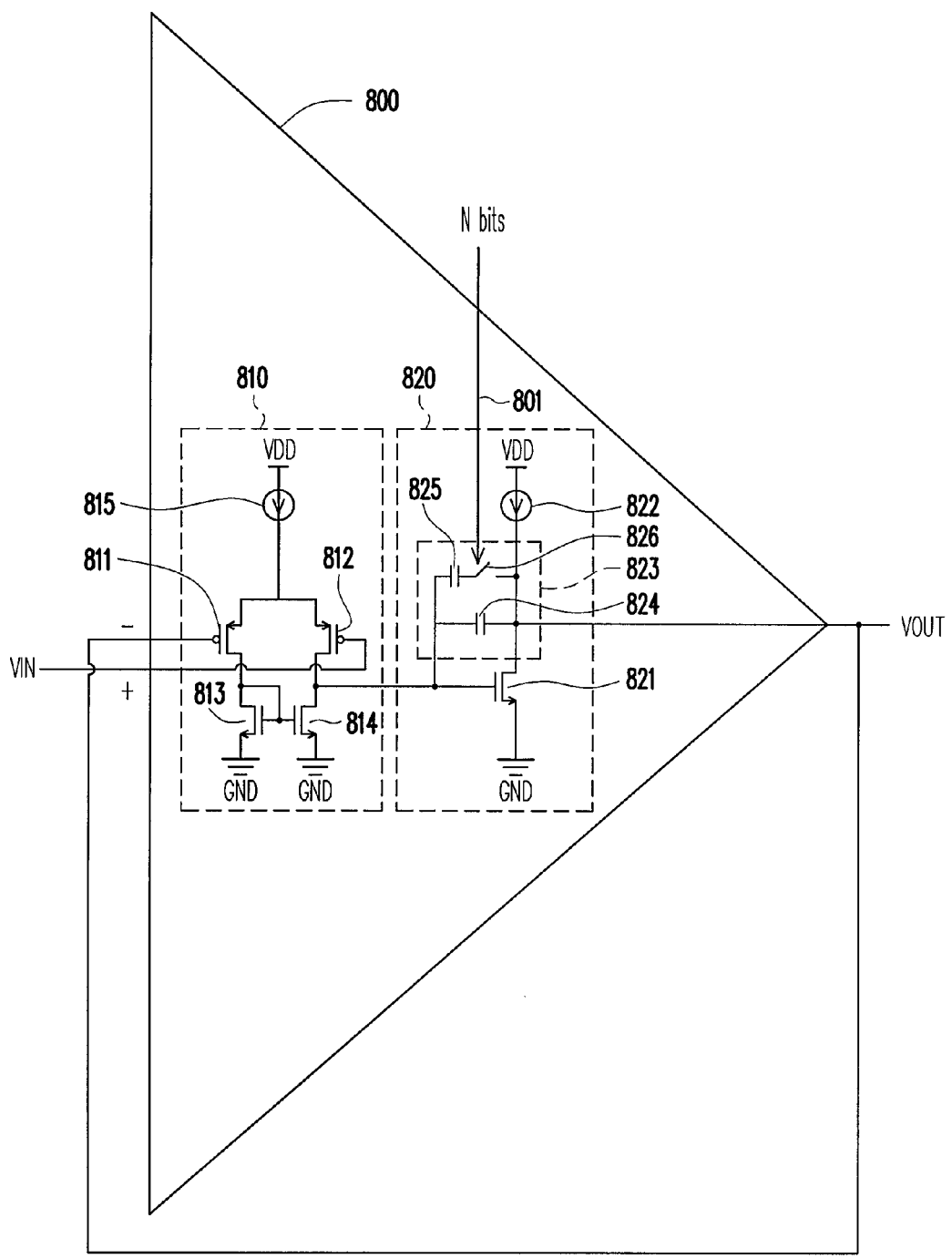

The signal amplifier 330 in FIG. 3 is implemented using an operational amplifier as shown in FIG. 8. FIG. 8 is a circuit diagram of an operational amplifier according to another embodiment of the present invention. As shown in FIG. 8, the operational amplifier 800 includes a positive input terminal, a negative input terminal, a control terminal (indicated by 801) and an output terminal. The positive input terminal of the operational amplifier 800 receives an analog signal VIN. The negative input terminal of the operational amplifier 800 is coupled to the output terminal of the operational amplifier. The control terminal 801 of the operational amplifier 800 receives at least one bit of the digital data IN. The output terminal of the operational amplifier 800 outputs a driving signal VOUT.

The operational amplifier 800 in FIG. 8 includes an input stage 810 and a gain stage 820. The input stage 810 is coupled to the positive input terminal and the negative input terminal of the operational amplifier 800 for receiving the analog signal VIN. The gain stage 820 is coupled to the input stage 810 for outputting and generating the driving signal VOUT according to the input stage 810 and determining the driving ability of the driving signal VOUT according to the signal received from the control terminal 801 of the operational amplifier.

The input stage 810 includes four transistors 811, 812, 813, 814 and a current source 815. In the present embodiment, the transistors 811 and 812 are implemented using P-MOSFET and the transistors 813 and 814 are implemented using N-MOSFET.

The gate of the transistor 811 serves as the negative input terminal of the operational amplifier. The gate of the transistor 812 serves as the positive input terminal of the operational amplifier. A first terminal of the current source 815 is coupled to the source of the transistors 811 and 812 and a second terminal of the current source 815 is coupled to a power voltage VDD (that is, a first voltage). The drain of the transistor 813 is coupled to the drain of the transistor 811 and the gate of the transistor 813 and the source of the transistor 813 are coupled to a ground voltage GND (that is, a second voltage). The drain of the transistor 814 is coupled to the drain of the transistor 812. The gate of the transistor 814 is coupled to the gate of the transistor 813. The source of the transistor 814 is also coupled to the ground voltage GND. The signal from the drain of the transistor 814 serves as the output from the input stage 810.

The gain stage 820 includes a transistor 821, a current source 822 and a controlled capacitance 823. The transistor 821 in the present embodiment is implemented using N-MOSFET. The gate of the transistor 821 receives the output from the input stage 810 and the source of the transistor 821 is coupled to the ground voltage GND. The current source 822 is coupled between the drain of the transistor 821 and the power voltage VDD. A first terminal and a second terminal of the controlled capacitance 823 are coupled to the gate and the drain of the transistor 821 respectively. The controlled capacitance 823 provides a capacitance determined by the signal from the control terminal 801 of the operational amplifier. The signal from the drain of the transistor 821 serves as the driving signal VOUT.

The controlled capacitance 823 includes capacitors 824, 825 and a switch 826. A first terminal and a second terminal of the capacitor 824 serve as the first terminal and the second terminal of the controlled capacitance 823. A first terminal of the capacitor 825 is coupled to the first terminal of the capacitor 824. A first terminal and a second terminal of the switch 826 are coupled to a second terminal of the capacitor 825 and the second terminal of the capacitor 824. Whether the switch 826 is conductive is determined by the signal from the control terminal 801 of the operational amplifier.

Since the method of operating the switch 826 in FIG. 8 is identical to the method of operating the switch 516 or the switch 536 in FIG. 5, a detailed description thereof is omitted. However, it should be noted that the slew rate (SR) of the operational amplifier can be represented by $SR=I/(C_1+C_2)$, wherein I is the current of the operational amplifier, and $C_1$ and $C_2$ represent the capacitance of the capacitors 824 and 825. Therefore, to increase the slew rate and accelerate the stabilization of the output voltage transition of the operational amplifier, the switch 826 needs to be opened, otherwise, the switch 826 should be shorted.

Figure 8A:
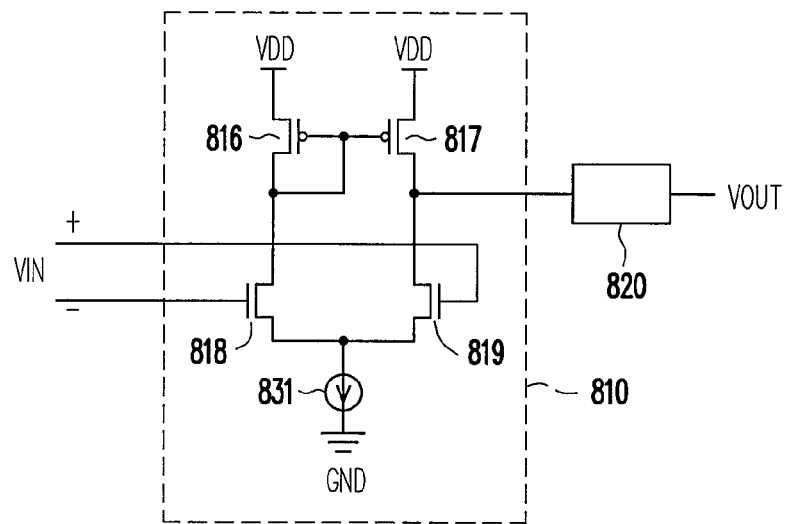
FIG. 8A is an example of an implementation of another type of input stage according to the present invention.

For those skilled in the art, other methods may be used to implement the input stage 810 and the gain stage 820. For example, FIG. 8A is an example of an implementation of another type of input stage 810 according to the present invention. As shown in FIG. 8A, the input stage 810 includes four transistors 816, 817, 818, 819 and a current source 831. In the present embodiment, the transistors 816 and 817 are implemented using P-MOSFET and the transistors 818 and 819 are implemented using N-MOSFET.

The gate of the transistor 819 serves as the positive input terminal of the operational amplifier. The gate of the transistor 818 serves as the negative input terminal of the operational amplifier. The two terminals of the current source 831 are coupled to the source of the transistors 818 and 819 and a first voltage (for example, a ground voltage GND). The drain of the transistor 816 is coupled to the drain of the transistor 818 and the gate of the transistor 816, and the source of the transistor 816 is coupled to a second voltage (for example, a power voltage VDD). The drain of the transistor 817 is coupled to the drain of the transistor 819. The gate of the transistor 817 is coupled to the gate of the transistor 816. The source of the transistor 817 is also coupled to the power voltage VDD. The signal from the drain of the transistor 817 serves as the output from the input stage 810.

Figure 8B:
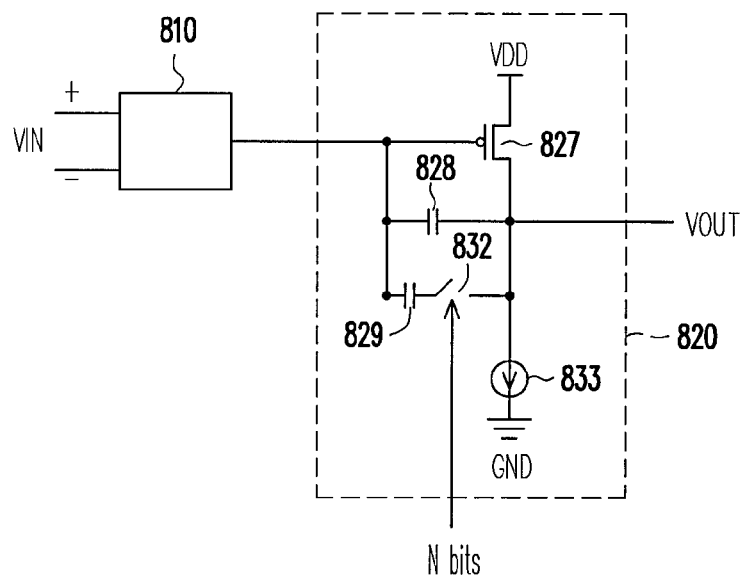
FIG. 8B is an example of an implementation of another type of gain stage according to the present invention.

FIG. 8B is an example of an implementation of another type of gain stage 820 according to the present invention. As shown in FIG. 8B, the gain stage 820 includes a transistor 827, a current source 833 and a controlled capacitance. The controlled capacitance includes capacitors 828, 829 and a switch 832. The transistor 827 in the present embodiment is implemented using P-MOSFET. The gate of the transistor 827 receives the output from the input stage 810 and the source of the transistor 827 is coupled to the power voltage VDD. The current source 833 is coupled between the drain of the transistor 827 and the ground voltage GND. A first terminal and a second terminal of the switch 832 are coupled to a second terminal of the capacitor 828 and a second terminal of the capacitor 829 respectively. Whether the switch 832 is conductive is determined by the signal from the control terminal 801 of the operational amplifier. Since the operating method in FIG. 8A and FIG. 8B are similar to that of FIG. 8, a detailed description thereof is omitted.

Figure 9:
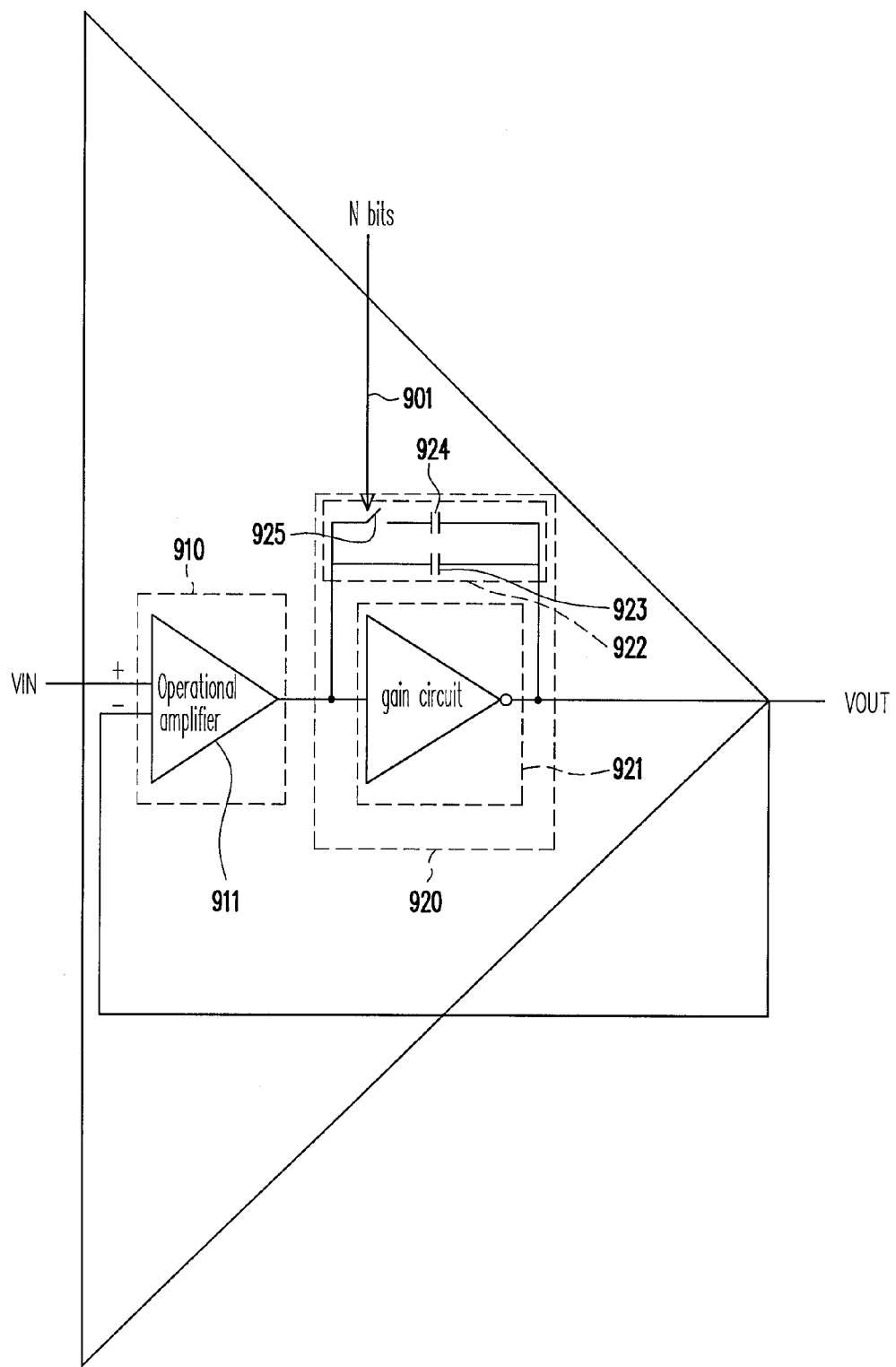
FIG. 9 is a circuit of an operational amplifier according to yet another embodiment of the present invention.

FIG. 9 is a circuit of an operational amplifier according to yet another embodiment of the present invention. As shown in FIG. 9, the operational amplifier includes a positive input terminal, a negative input terminal, a control terminal (indicated by 901) and an output terminal. The positive input terminal of the operational amplifier receives an analog signal VIN. The negative input terminal of the operational amplifier is coupled to the output terminal of the operational amplifier. The control terminal 901 of the operational amplifier receives at least one bit of the digital data IN. The output terminal of the operational amplifier outputs a driving signal VOUT.

The operational amplifier in FIG. 9 similar includes an input stage 910 and a gain stage 920. The input stage 910 includes an operational amplifying circuit 911. The positive input terminal of the operational amplifying circuit 911 receives the analog signal VIN. The signal output from the operational amplifying circuit 911 is the output from the input stage 910.

The gain stage 920 includes a gain circuit 921 and a controlled capacitance 922. An input terminal of the gain circuit is coupled to the output terminal of the operational amplifying circuit 911. A first terminal and a second terminal of the controlled capacitance 922 are coupled to the input terminal and the output terminal of the gain circuit 921 respectively. The controlled capacitance 922 provides an amount of capacitance according to the signal from the control terminal 901 of the operational amplifier.

The controlled capacitance 922 includes capacitors 923, 924 and a switch 925. A first terminal and a second terminal of the capacitor 923 serve as the first terminal and the second terminal of the controlled capacitance 922. A first terminal of the capacitor 924 is coupled to the first terminal of the capacitor 923. A first terminal and a second terminal of the switch 925 are coupled to a second terminal of the capacitor 924 and the second terminal of the capacitor 923. Whether the switch 925 is conductive is determined by the signal from the control terminal 901 of the operational amplifier.

Similar to the embodiment described with reference to FIG. 8, the method of operating the switch 925 in FIG. 9 is identical to the method of operating the switch 516 or 536 of FIG. 5. Hence, a detailed description thereof is omitted. However, it should be noted that the slew rate (SR) of the operational amplifier can be represented by $SR=I/(C_1+C_2)$, wherein I is the current of the operational amplifier, and $C_1$ and $C_2$ represent the capacitance of the capacitors 923 and 924. Therefore, to increase the slew rate and accelerate the stabilization of the output voltage transition of the operational amplifier, the switch 925 needs to be opened, otherwise, the switch 925 should be shorted.

Figure 10:
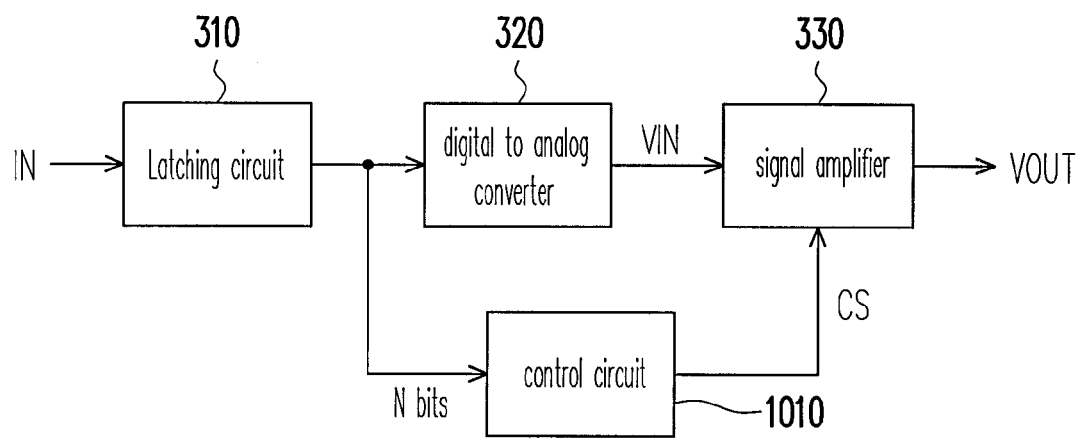
FIG. 10 is a block diagram of a driving apparatus according to another embodiment of the present invention.

Although the foregoing embodiments have fully disclosed the applications of the present invention, the user may control the on-off timing of the switch besides controlling the on-off states of the switch according to the signal received from the control terminal of the operational amplifier in some high-grade applications as shown in FIG. 10.

FIG. 10 is a block diagram of a driving apparatus according to another embodiment of the present invention. Refer to FIGS. 10 and 4 according to the requirements in the description. The circuit in FIG. 10 is the circuit in FIG. 3 with an additional control circuit 1010. The latching circuit 310 is used for latching and providing a digital data IN (step 410 in FIG. 4). The digital to analog converter 320 receives the digital data IN output from the latching circuit 310 and converts the digital data IN into an analog signal VIN (step 420 in FIG. 4). The control circuit 1010 is used for generating a control signal CS according to at least one bit of the digital data IN. The signal amplifier 330 is coupled to the digital to analog converter 320 and the control circuit 1010. The signal amplifier 330 is used for receiving the analog signal VIN and the control signal CS and dynamically determining a driving ability according to the control signal CS (may be regarded as utilizing at least one bit of the digital data IN for dynamically determining the driving ability, as shown in step 430 of FIG. 4). Next, a driving signal VOUT is generated according to the analog signal IN and the determined driving capability (step 440 in FIG. 4).

More specifically, the control signal CS is used to control the switches 516 and 536 in FIG. 5, or the switch 516 in FIG. 6, or the on-off state and on-off time of the switch 536 in FIG. 7. Obviously, the control signal CS can be used to control the switch 826 in FIG. 8, or the on-off state and on-off time of the switch 925 in FIG. 9. Therefore, the control signal CS not only can be used to control the size of current in the operational amplifier, but can also be used to control the size of compensation capacitance of the operational amplifier and the time for changing the compensation capacitance.

Figure 11:
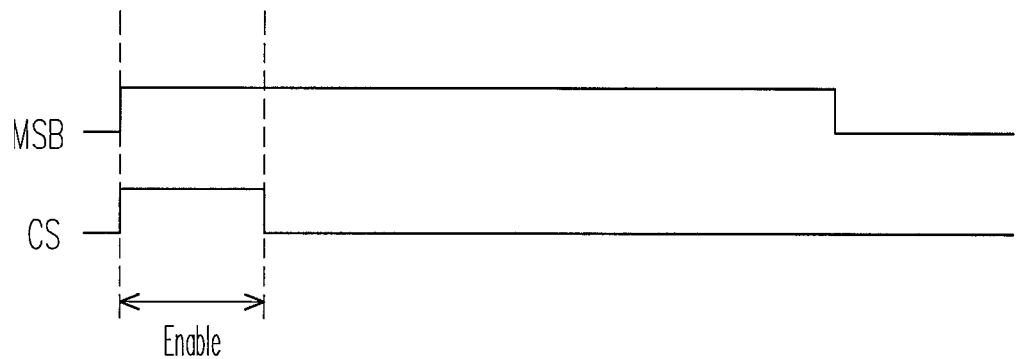
FIG. 11 is a timing diagram of a control signal and the most significant bit.

In the following, the timing of one of the bits in the digital data IN, for example, the most significant bit (MSB), and the control signal CS are used to illustrate the mode of action of the control signal CS, as shown in FIG. 11. However, the timing description is only used as an illustration and is not intended to limit the scope of the present invention. FIG. 11 is a timing diagram of a control signal and the most significant bit. As show in FIG. 11, the control signal CS is enabled for a short time before returning to its original state when the most significant bit (MSB) is in a high logical state (a high voltage). Therefore, the on-off state of the switch controlled by the control signal CS will be changed only momentarily.

In other words, regardless of the actual design of the circuit inside the control circuit 1010, the best design method is to allow the control signal CS to control the on-off state of the switch in the operational amplifier such that the current or the compensation capacitance of the operational amplifier produces changes when the output voltage of the operational amplifier varies over a large range so that the slew rate of the operational amplifier is increased and the driving capability is enhanced. Afterwards, the operation of the switch is reversed so that the original slew rate is restored to save power consumption.

Figure 12:
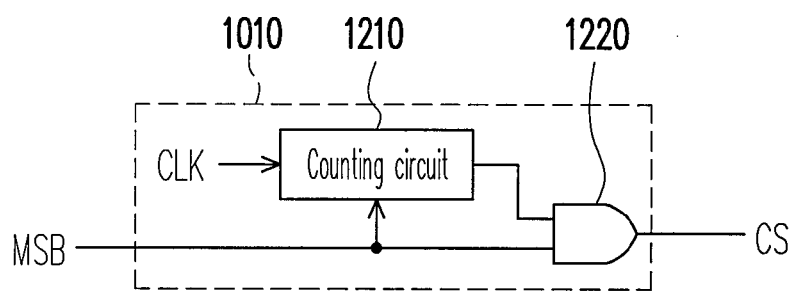
FIG. 12 is a circuit diagram of a control circuit according to an embodiment of the present invention.

In the following, three kinds of implementations of the control circuit 1010 are described and FIG. 12 shows one of them. FIG. 12 is a circuit diagram of a control circuit according to an embodiment of the present invention. As shown in FIG. 12, the control circuit 1010 in the present embodiment includes a counting circuit 1210 and an AND gate 1220. The counting circuit 1210 is used for receiving and counting a clock signal CLK. When the most significant bit (MSB) of the digital data IN changes state (for example, increases to a high level), the counting circuit 1210 starts to count the clock signal CLK. The output from the counting circuit 1210 at this moment is 1, for example. When the count reaches a preset value, the counting circuit 1210 outputs a logic '0' result. The AND gate 1220 is used for receiving the result from the counting circuit 1210 and at least one bit of the digital data IN and generating the control signal CS accordingly.

Figure 13:
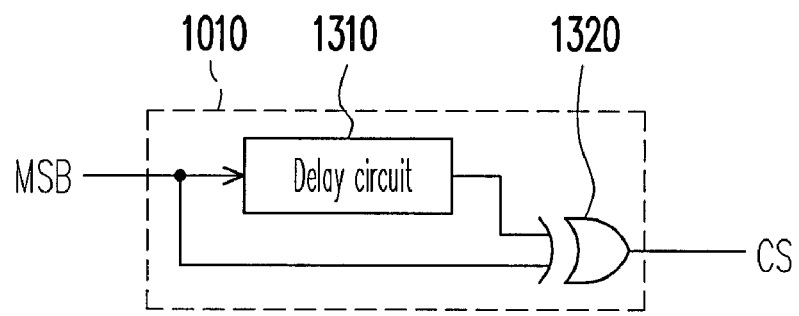
FIG. 13 is a circuit diagram of a control circuit according to another embodiment of the present invention.

FIG. 13 is a circuit diagram of a control circuit according to another embodiment of the present invention. As shown in FIG. 13, the control circuit 1010 in the present embodiment includes a delay circuit 1310 and a NOR gate 1320. The delay circuit 1310 is used for receiving at least one bit of the digital data IN and producing a delay. The NOR gate 1320 is coupled to the delay circuit 1310 for receiving at leas one bit of the digital data IN and the output from the delay circuit 1310 and generating the control signal CS accordingly.

Figure 14:
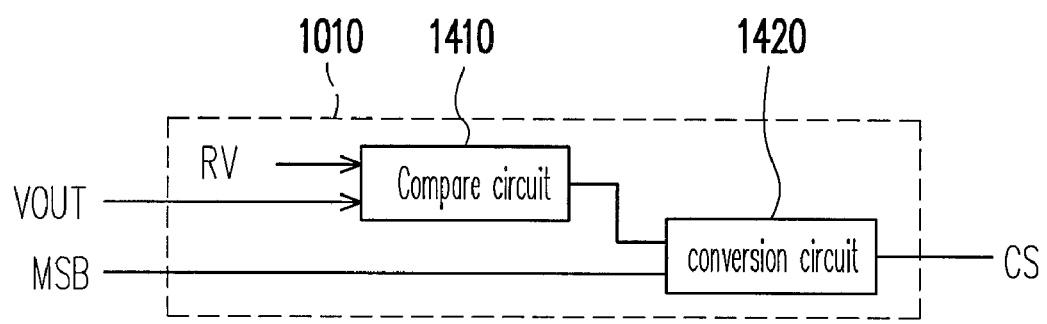
FIG. 14 is a circuit diagram of a control circuit according to yet another embodiment of the present invention.

FIG. 14 is a circuit diagram of a control circuit according to yet another embodiment of the present invention. As shown in FIGS. 14 and 10, the control circuit 1010 in the present embodiment includes a compare circuit 1410 and a conversion circuit 1420. The compare circuit 1410 is coupled to the output terminal of the signal amplifier 330 for receiving and comparing a reference value (RV) with the driving signal VOUT. The level of the reference value RV may be randomly set by the user, for example, set to a level of $9/10^{th}$ of driving signal VOUT. The conversion circuit 1420 is coupled to the compare circuit 1410 for converting at least one bit of the received digital data IN into the control signal CS according to the compare result of the compare circuit 1410.

Although the foregoing embodiments have already described a number of possible implementations for the circuits inside the operational amplifier and control circuit, anyone skilled in the art would know that the method of designing operational amplifier and control circuit may be different for different manufacturer. Hence, as long as the design utilizes at least one bit of the digital data IN to dynamically change the current or the compensation capacitance of the operational amplifier so that the driving ability of the driving signal is dynamically changed, or utilizes at least one bit of the digital data IN to generate a control signal and using the control signal to dynamically change the current or the compensation capacitance of the operational amplifier so that the driving capability of the driving signal is dynamically changed, which shall also be construed to be within the scope of the present invention.

In summary, the present invention determines the output voltage range of an operational amplifier according to a digital data. When the range of variation exceeds a pre-determined value, the slew rate of the operational amplifier is dynamically changed according to at least one bit of the digital data. Hence, the stabilizing time of the output voltage transition of the operational amplifier is dynamically changed and the driving ability of the driving signal output from the operational amplifier is dynamically changed. The method of changing the slew rate of the operational amplifier includes controlling the size of current in the operational amplifier or changing the compensation capacitance of the operational amplifier, or simultaneously changing both. Therefore, the present invention can dynamically adjust the driving ability of the driving signal according to the output voltage range so that an optimal balance between the stabilization time of the output voltage transition of the operational amplifier and the power consumption of the operational amplifier is found.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A driving apparatus, comprising:
    a digital to analog converter, receiving a digital data and converting the digital data into an analog signal; and
    a signal amplifier, coupled to the digital to analog circuit, receiving the analog signal and generating a driving signal and dynamically changing a driving capability of the driving signal according to at least one bit of the digital data,
    wherein the signal amplifier comprises an operational amplifier, the operational amplifier comprises:
    an input stage, coupled to a positive input terminal and a negative input terminal of the operational amplifier, receiving the analog signal; and
    a gain stage, coupled to the input stage, generating the driving signal according to an output from the input stage, wherein the gain stage comprises a controlled capacitance, the controlled capacitance comprises a plurality of capacitors coupled in parallel between a first terminal and a second terminal of the controlled capacitance, and a capacitance of the controlled capacitance is determined according to the at least one bit of the digital data a control terminal of the operational amplifier so as to determine the driving capability of the driving signal.

2. The driving apparatus of claim 1, wherein the input stage comprises:
    a first transistor, having a gate serving as the positive input terminal of the operational amplifier;
    a second transistor, having a gate serving as the negative input terminal of the operational amplifier;
    a first current source, having a first terminal coupled to a first source/drain of the first transistor and a first source/drain of the second transistor, and a second terminal of the first current source coupled to a first voltage;
    a third transistor having a first source/drain coupled to a second source/drain of the first transistor and a gate of the third transistor, and a second source/drain of the third transistor coupled to a second voltage; and
    a fourth transistor, having a first source/drain coupled to a second source/drain of the second transistor, a gate of the fourth transistor coupled to a gate of the third transistor, a second source/drain of the fourth transistor coupled to the second voltage, wherein a signal from the first source/drain of the fourth transistor serves as the output from the input stage.

3. The driving apparatus of claim 1, wherein the gain stage further comprises:
    a fifth transistor having a gate for receiving the output from the input stage, and a second source/drain of the fifth transistor coupled to the second voltage; and
    a second current source, coupled between a first source/drain of the fifth transistor and the first voltage;
    wherein a signal from the first source/drain of the fifth transistor serves as the driving signal and the first terminal and the second terminal of the controlled capacitance are coupled to the gate and a first source/drain of the fifth transistor respectively.

4. The driving apparatus of claim 3, wherein the controlled capacitance comprises:
    a first capacitor, having a first terminal and a second terminal serving as the first terminal and the second terminal of the controlled capacitance;
    a second capacitor, having a first terminal coupled to the first terminal of the first capacitor; and
    a switch, having a first terminal and a second terminal coupled to a second terminal of the second capacitor and the second terminal of the first capacitor respectively, for determining the conductive state of the switch according to the at least one bit of the digital data from the control terminal of the operational amplifier.

5. The driving apparatus of claim 3, wherein the first transistor and the second transistors are P-type metal oxide semiconductor field effect transistors, and the third transistor, the fourth transistor and the fifth transistor are N-type metal oxide semiconductor field effect transistors.

6. The driving apparatus of claim 5, wherein the first voltage is a power voltage and the second voltage is a ground voltage.

7. The driving apparatus of claim 1, wherein the input stage comprises:
    an operational amplifying circuit, having a positive input terminal for receiving the analog signal and a negative input terminal coupled to the output terminal of the operational amplifying circuit, wherein a signal output from the operational amplifying circuit is the output of the input stage.

8. The driving apparatus of claim 7, wherein the gain stage further comprises a gain circuit having an input terminal coupled to the output terminal of the operational amplifying circuit, and the controlled capacitance having a first terminal and a second terminal coupled to the input terminal and the output terminal of the gain circuit respectively.

9. The driving apparatus of claim 8, wherein the controlled capacitance comprises:
    a first capacitor, having a first terminal and a second terminal serving as the first terminal and the second terminal of the controlled capacitance;
    a second capacitor, having a first terminal coupled to the first terminal of the first capacitor; and
    a switch, having a first terminal and a second terminal coupled to a second terminal of the second capacitor and the second terminal of the first capacitor respectively, for determining the conductive stage of the switch according to the at least one bit of the digital data from the control terminal of the operational amplifier.

* * * * *